United States Patent [19]
Doan et al.

[11] Patent Number: 6,074,902
[45] Date of Patent: Jun. 13, 2000

[54] METHOD OF FORMING COMPLEMENTARY TYPE CONDUCTIVE REGIONS ON A SUBSTRATE

[75] Inventors: Trung Tri Doan, Boise; Charles H. Dennison, Meridian, both of Id.

[73] Assignee: Micron Technology, Inc., Boise, Id.

[21] Appl. No.: 08/996,086

[22] Filed: Dec. 22, 1997

Related U.S. Application Data

[62] Division of application No. 08/606,205, Feb. 23, 1996, Pat. No. 5,824,576.

[51] Int. Cl.⁷ .................................................. H01L 21/8238
[52] U.S. Cl. ......................... 438/199; 438/199; 438/275; 438/634; 438/738
[58] Field of Search ...................... 438/199, 275, 438/299, 558, 564, 585, 631, 634, 652, 670, 692, 738, 231, 232, 229, 289, FOR 216, FOR 217, FOR 218; 216/38

[56] References Cited

U.S. PATENT DOCUMENTS

| | | | |
|---|---|---|---|
| 4,555,842 | 12/1985 | Levinstein et al. | 438/232 |
| 4,605,447 | 8/1986 | Brotherton et al. | 438/474 |
| 4,637,836 | 1/1987 | Flatley et al. | 438/585 |
| 4,871,688 | 10/1989 | Lowrey | 438/252 |
| 5,132,236 | 7/1992 | Doan | 438/232 |
| 5,162,245 | 11/1992 | Favreau | 438/365 |
| 5,244,835 | 9/1993 | Hachiya | 438/672 |
| 5,393,233 | 2/1995 | Hong et al. | 438/289 |
| 5,480,830 | 1/1996 | Liao et al. | 438/199 |
| 5,534,462 | 7/1996 | Fiordalice et al. | 438/634 |
| 5,563,093 | 10/1996 | Koda et al. | 438/231 |
| 5,573,633 | 11/1996 | Gambino et al. | 438/533 |
| 5,604,155 | 2/1997 | Wang | 438/626 |
| 5,654,242 | 8/1997 | Komatsu | 438/585 |
| 5,736,457 | 4/1998 | Zhao | 438/624 |
| 5,770,490 | 6/1998 | Frenette et al. | 438/199 |
| 5,926,729 | 7/1999 | Tsai et al. | 438/591 |
| 5,930,616 | 6/1998 | Dennison | 438/232 |

FOREIGN PATENT DOCUMENTS 000263756  4/1988  European Pat. Off. ...... 438/FOR 216

*Primary Examiner*—Carl Whitehead, Jr.
*Assistant Examiner*—Jeff Vockrodt
*Attorney, Agent, or Firm*—Wells, St. John, Roberts, Gregory & Matkin, P.S.

[57] ABSTRACT

A method of forming complementary type conductive regions on a substrate includes, a) providing a first etch stop layer over a substrate; b) etching a void through the first etch stop layer inwardly towards the substrate; c) providing a first conductive layer of a first conductive material over the first etch stop layer and into the void; d) removing the first conductive layer over the first etch stop layer to eliminate all first conductive material from atop the first etch stop layer, and leaving first conductive material in the void; e) removing the remaining first etch stop layer from the substrate thereby defining a remaining region of first conductive layer; f) providing a second conductive layer of a second conductive material over the substrate and remaining first conductive layer region; and g) removing the second conductive layer over the first conductive layer to eliminate all second is conductive material from atop the first conductive layer, and leaving second conductive material atop the substrate which is adjacent the projecting first conductive material region.

14 Claims, 10 Drawing Sheets

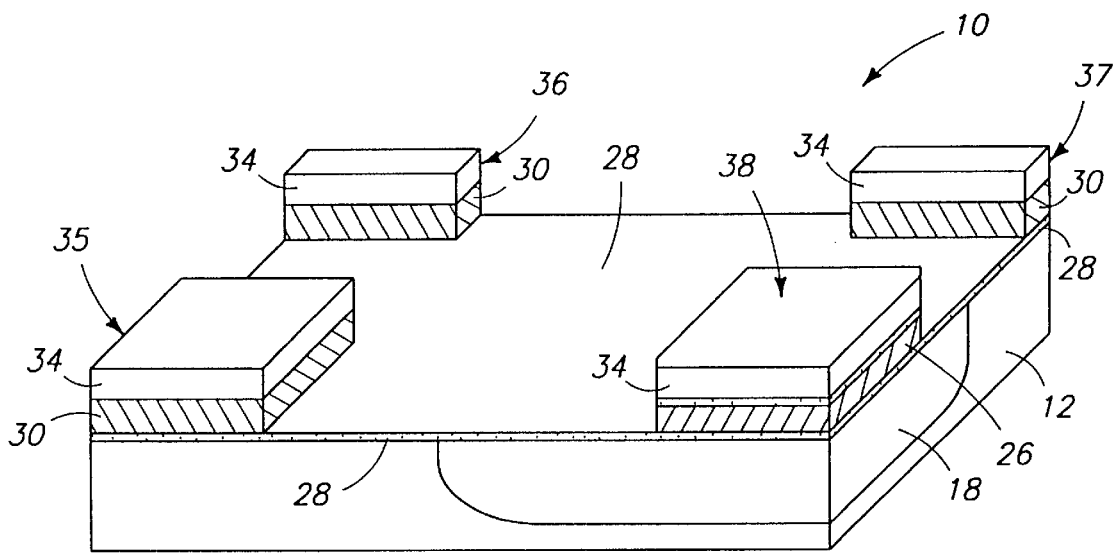
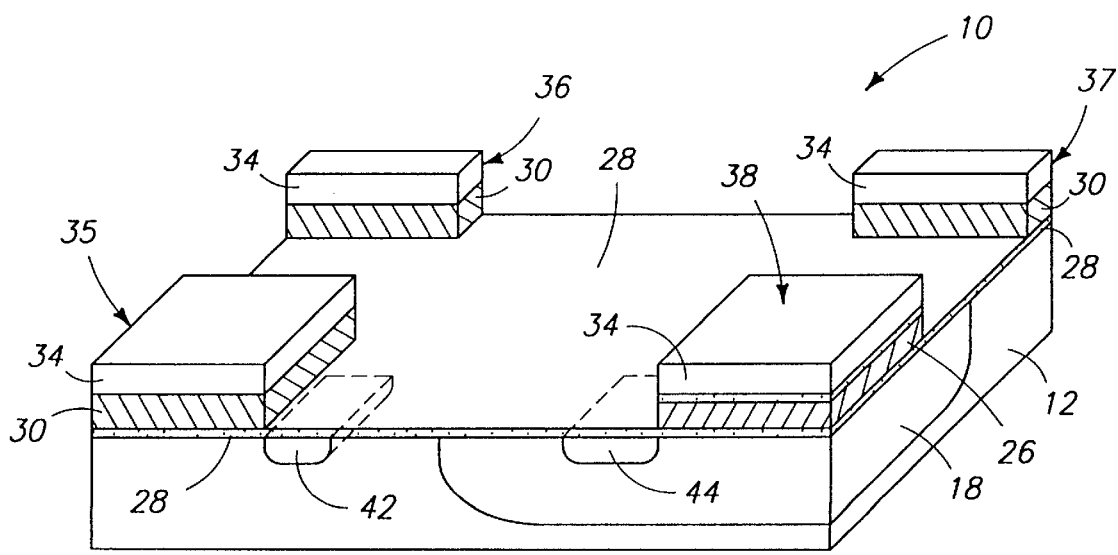
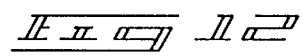

METHOD OF FORMING COMPLEMENTARY TYPE CONDUCTIVE REGIONS ON A SUBSTRATE

RELATED PATENT DATA

This patent results from a divisional application of U.S. patent application Ser. No. 08/606,205, which was filed on Feb. 23, 1996, now U.S. Pat. No. 5,824,576.

TECHNICAL FIELD

This invention relates to methods of forming complementary type conductive regions on a substrate, and to methods of forming complementary type polysilicon field effect transistors on a substrate.

BACKGROUND OF THE INVENTION

In fabricating field effect transistors and other electronic devices, it is often desirable to have different (complementary) conductive material for different devices at approximately the same level within the substrate. For example, complementary field effect transistors utilize p-channel transistors in one location and n-channel transistors in another location. Conductively doped polysilicon is presently the material of choice for formation of gate electrodes for such transistors. P-channel devices optimally utilize p-type polysilicon for the gate electrodes, whereas n-channel device optimally utilize r-type polysilicon for the gate electrodes. This has required multiple maskings specifically dedicated for deposition or doping of the specific polysilicon type. Each masking step in semiconductor processing increases complexity, expense and corresponding risk of destruction of the wafer being processed. Mask step minimization is a typical, but sometimes elusive, goal in semiconductor wafer processing.

It would be desirable to develop methods for forming complementary-type polysilicon field effect transistors on a substrate which eliminates at least one mask step. Although the invention arose from this primary concern, the artisan will appreciate that the invention ha s applicability to methods of forming other different (complementary) conductive regions on a substrate. The invention is intended to only be limited by the accompanying claims appropriately interpreted in accordance with the Doctrine of Equivalents.

BRIEF DESCRIPTION OF THE DRAWINGS

Preferred embodiments of the invention are described below with reference to the following accompanying drawings.

FIG. 11 is a view of the FIG. 1 wafer fragment at a processing step subsequent to that shown by FIG. 10.

FIG. 12 is a view of the FIG. 1 wafer fragment at a processing step subsequent to that shown by FIG. 11.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming complementary type polysilicon field effect transistors on a substrate comprises:

providing a first etch stop layer over a substrate;

etching a void through the first etch stop layer inwardly to the substrate;

oxidizing substrate exposed by the void to form a first gate oxide layer;

providing a first layer of polysilicon of a first conductivity type over the first etch stop layer and into the void over the first gate oxide layer;

removing the first layer of polysilicon over the first etch stop layer to eliminate all polysilicon from atop the first etch stop layer, and leaving first conductivity type polysilicon in the void;

removing the remaining first etch stop layer from the substrate thereby defining a remaining region of first conductivity type polysilicon;

oxidizing substrate exposed by removal of the first etch stop layer to form a second gate oxide layer, said oxidizing steps being differently conducted to produce different first and second gate oxide layers which are separately optimized for their associated respective field effect transistors;

providing a second layer of polysilicon of a second conductivity type over the second gate oxide layer and remaining first conductivity type polysilicon region;

removing the second layer of polysilicon over the remaining first layer of polysilicon to eliminate all second conductive material from atop the remaining first layer of polysilicon, and leaving second layer polysilicon atop the substrate which is adjacent the remaining first polysilicon region;

patterning and etching the remaining first polysilicon region and remaining second polysilicon layer in the same masking step to define complementary transistor gates in the same masking step; and implanting source and drain regions for the complementary transistor gates.

In accordance with another aspect of the invention, a method of forming complementary type conductive regions on a substrate comprises:

providing a first conductive layer of a first conductive material over a substrate;

etching a void through the first conductive layer;

providing a second conductive layer of a second conductive material over the first conductive layer and into the void, the second material being different from the first material; and removing the second conductive layer over the first conductive layer to eliminate all second conductive material from atop the first a conductive layer, and leaving second conductive material adjacent first conductive material atop the substrate in the prior void.

Figure 1:
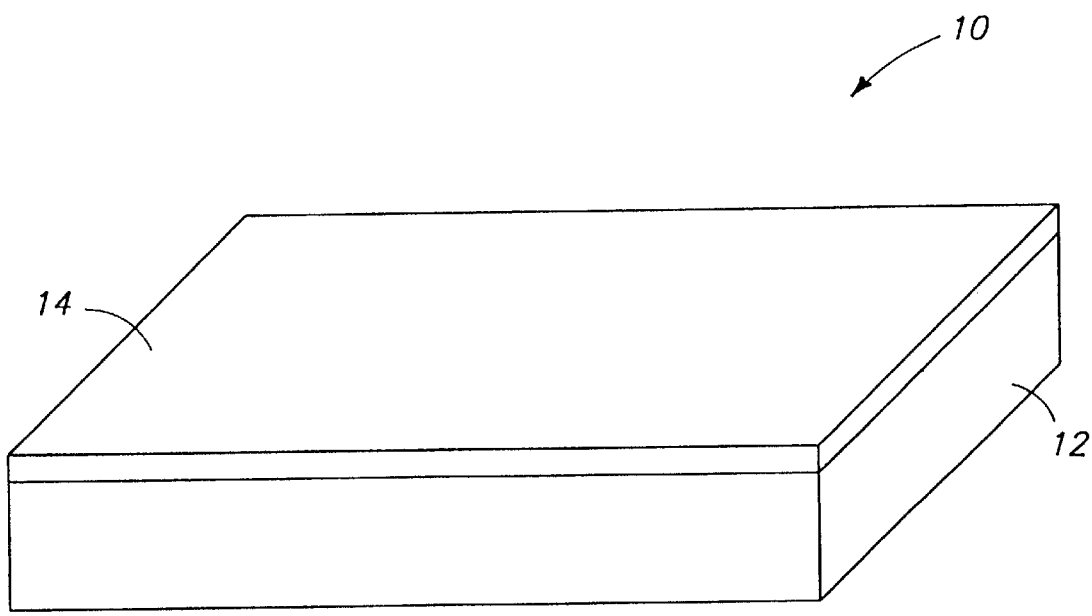
FIG. 1 is a diagrammatic isometric view of a semiconductor wafer fragment at one processing step in accordance with the invention.

More particularly and with reference to the figures, FIG. 1 illustrates a semiconductor wafer fragment indicated generally by reference numeral 10. Such comprises a semiconductive bulk substrate 12 (i.e., monocrystalline silicon) and overlying first etch stop layer 14. Substrate 12 has preferably previously been doped with a conductivity enhancing impurity of "p" or "n" type. For example, a p-type implant of substrate 12 could be conducted, followed by an implant drive with a 2,000 Angstroms-thick layer of oxide, and subsequent oxide strip. First etch stop layer 14 preferably comprises a material which is selectively etchable relative to bulk substrate material 12 and to a specific conductive material which will be subsequently deposited. An example and preferred material is a nitride, such as $Si_3N_4$. Alternately, layer 14 might comprise a composite layer, such as of a nitride and an oxide.

Figure 2:
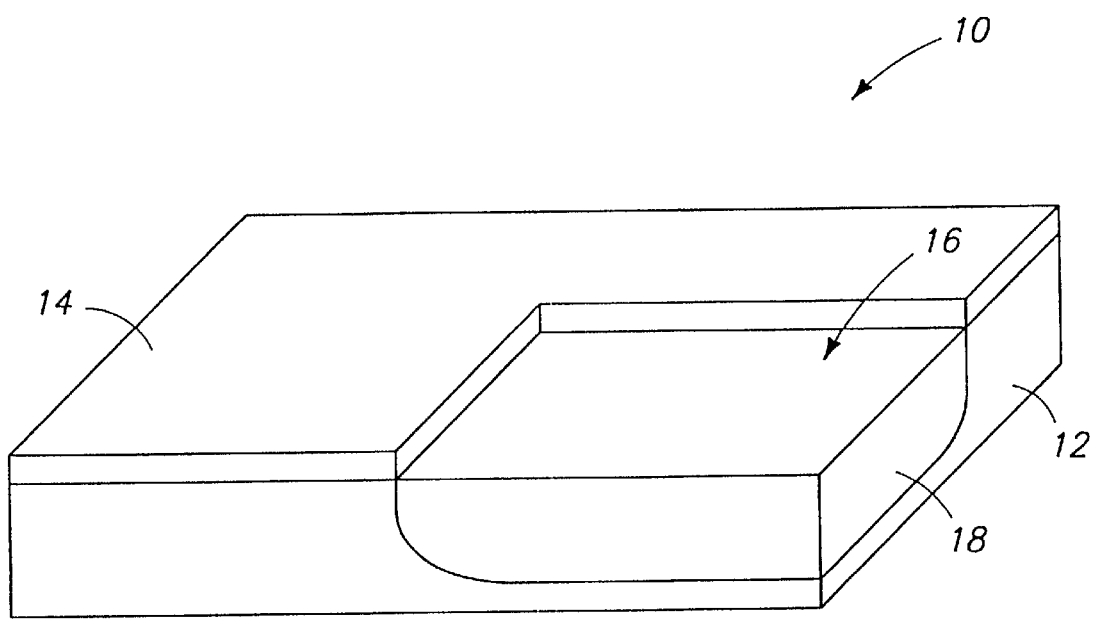
FIG. 2 is a view of the FIG. 1 wafer fragment at a processing step subsequent to that shown by FIG. 1.

Referring to FIG. 2, fragment 10 is masked and patterned with photoresist (not shown), and a void 16 is etched through first etch stop layer 14 inwardly in the direction of substrate 12 to outwardly expose substrate 12. Then, implanting into substrate 12 is conducted through void 16, with a "p" or "n" conductivity type implant material which is complementary to substrate 12 doping, to form a "p" or "n" type conductivity substrate well 18. Accordingly where for example bulk substrate 12 has been previously doped with p-type material, substrate well 18 will constitute an n-type well.

Figure 3:
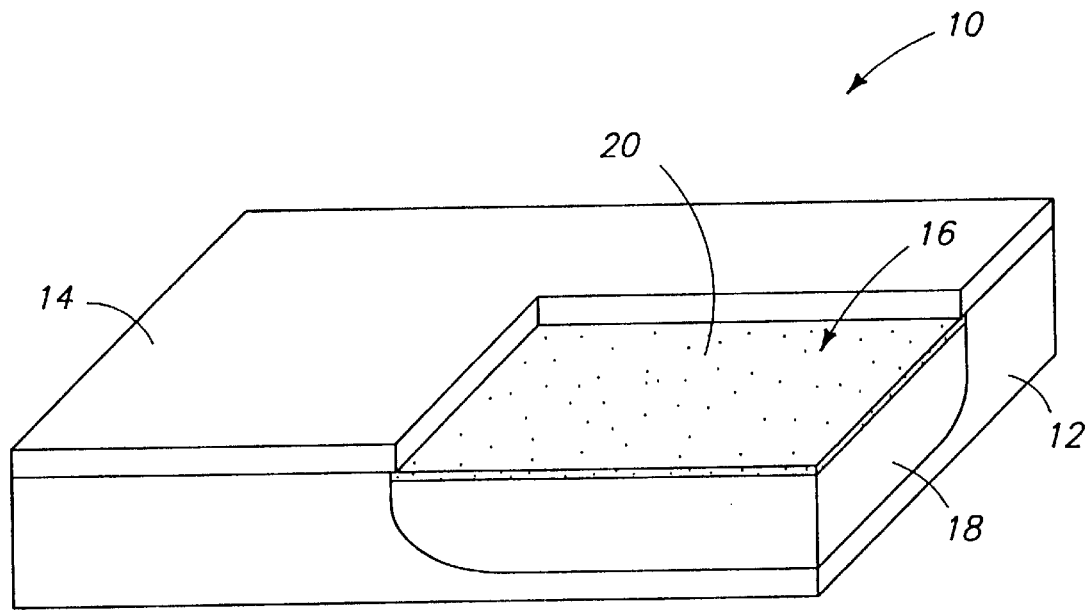
FIG. 3 is a view of the FIG.1 wafer fragment at a processing step subsequent to that shown by FIG. 2.

Referring to FIG. 3, a first gate dielectric layer 20 is provided over exposed substrate 12 within void 16. Such is preferably conducted by a wet, or dry or combination oxidation of the exposed substrate. The particular oxidation is preferably optimized for creation of what will be p-channel field effect transistors formed relative to n-well 18. Alternately, layer 20 could be provided by a deposition, as opposed to growth process. A first optimized $V_T$ implant (not shown) can be conducted into well 18 before or after provision of layer 20. Such would typically constitute p-type material optimized to favorably impact threshold voltage of the resultant transistor device.

Figure 4:
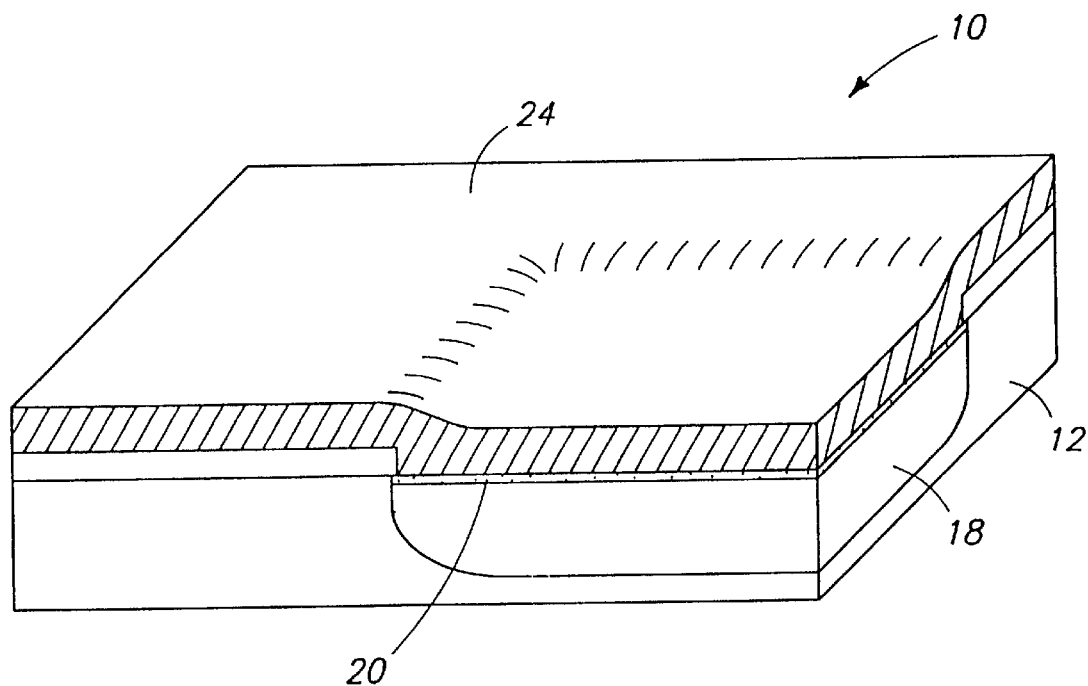
FIG. 4 is a view of the FIG. 1 wafer fragment at a processing step subsequent to that shown by FIG. 3.

Referring to FIG. 4, a first conductive layer 24 of a first conductive material is provided over first etch stop layer 14 and into void 16. Accordingly in this described embodiment, layer 24 is also provided over gate oxide layer 20. An example and preferred material for layer 24 is polysilicon of one of p-type or n-type conductivity. Most preferably in conjunction with the described embodiment, layer 24 will constitute p-type doped polysilicon (hereinafter in the specification designated as the "first type") for formation of p-type channel devices.

Figure 5:
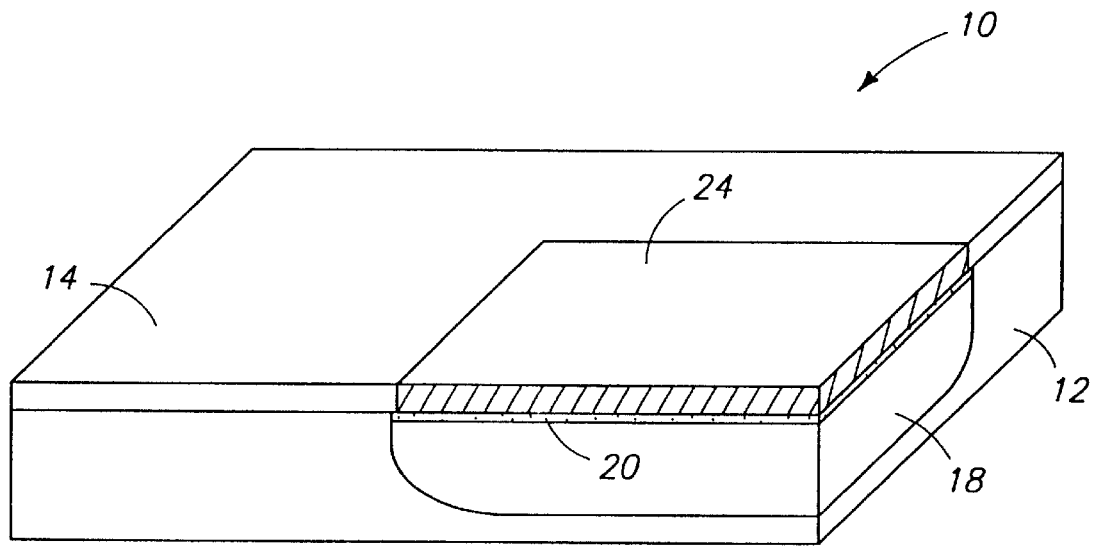
FIG. 5 is a view of the FIG. 1 wafer fragment at a processing step subsequent to that shown by FIG. 4.

Referring to FIG. 5, first conductive layer 24 overlying first etch stop layer 14 is removed to eliminate all first conductive material from atop such first etch stop layer, and to leave first conductive material within void 16. The preferred process for effecting such removal is chemical-mechanical polishing, effectively utilizing layer 14 as a chemical-mechanical etch stop. Where layer 24 comprises polysilicon and layer 14 comprises nitride, an example chemical-mechanical polishing slurry would include a dilute colloidal silica solution having a pH of 13.5. Alternately by way of example only, a planarizing layer such as photoresist could be applied and subsequently etched back.

Figure 6:
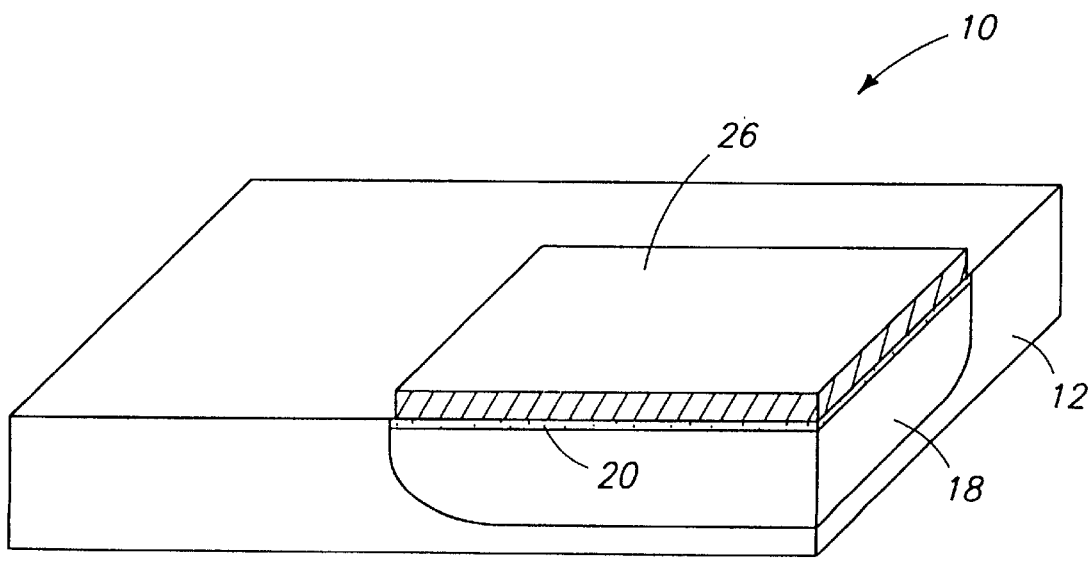
FIG. 6 is a view of the FIG. 1 wafer fragment at a processing step subsequent to that shown by FIG. 5.

Referring to FIG. 6, the remaining first etch stop layer material 14 is removed from the substrate, thereby defining a remaining region 26 of first conductive layer material projecting outwardly of substrate 12. An example removal technique would be a wet nitride strip utilizing hot phosphoric acid, which will selectively strip the nitride relative to the underlying silicon, the polysilicon and oxide 20.

Figure 7:
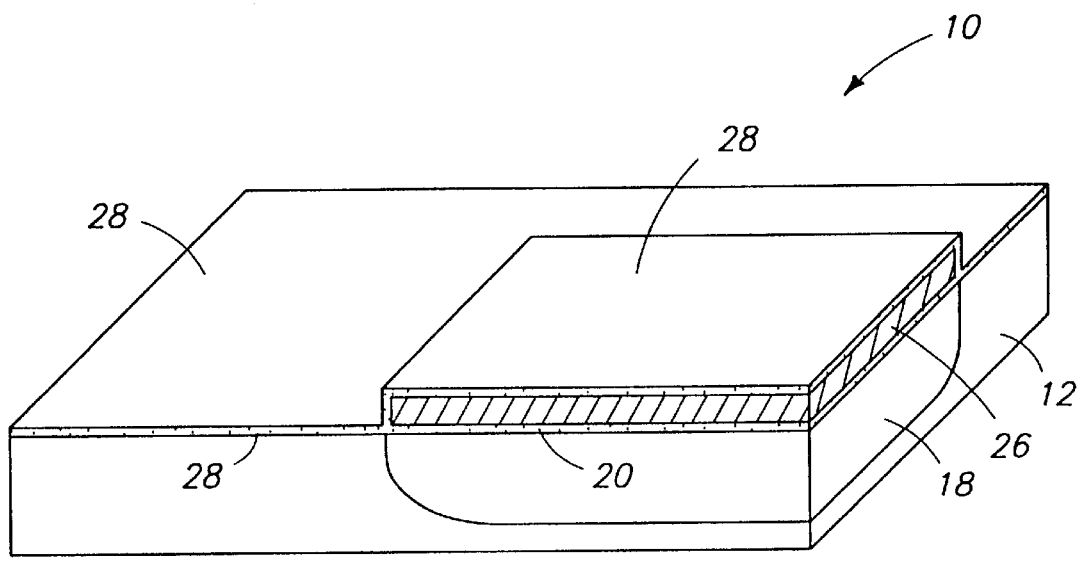
FIG. 7 is a view of the FIG. 1 wafer fragment at a processing step subsequent to that shown by FIG. 6.

Referring to FIG. 7, exposed substrate 12 and exposed areas of remaining region 26 are oxidized to form a second gate oxide layer 28, with such oxide also forming over exposed areas of region 26. Oxidation to produce second gate oxide layer 28 can be conducted differently from that process utilized to produce first gate oxide layer 20 to produce different first and second oxide layers 20 and 28, respectively, which are separately optimized for their associated respective field effect transistors. Such can be accomplished without additional masking steps. The oxide of layer 28 formed over remaining and projecting region 26 will function as a subsequent second etch stop layer, as will be described below. A second optimized $V_T$ implant (not shown) can be conducted into substrate 12 before or after provision of layer 28. Such would typically constitute n-type material optimized to favorably impact threshold voltage of the resultant transistor device.

Figure 8:
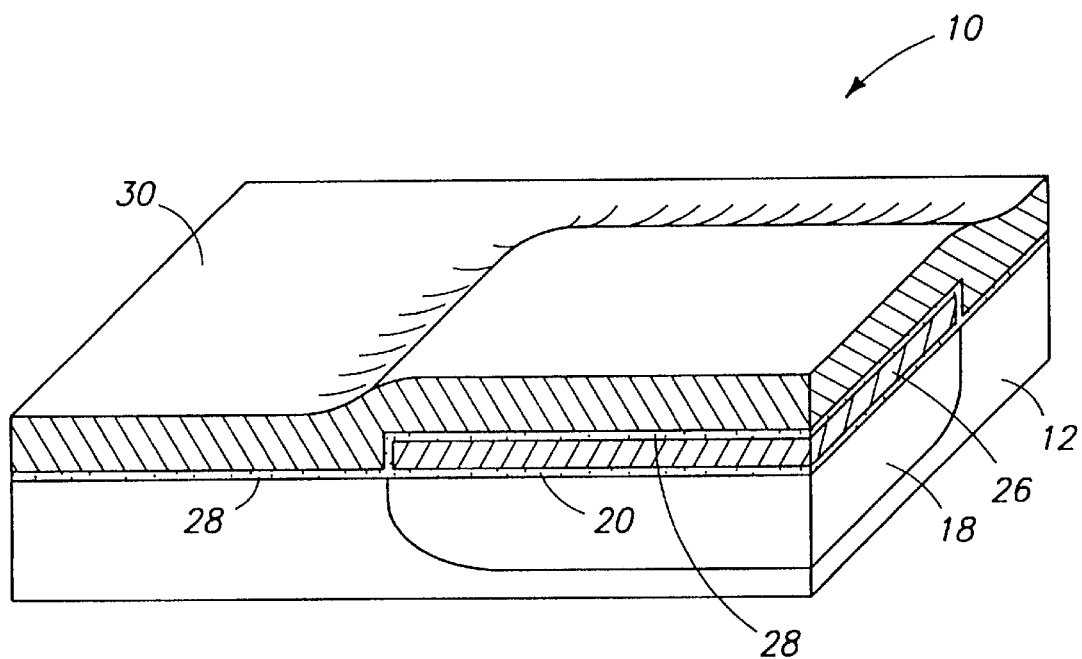
FIG. 8 is a view of the FIG. 1 wafer fragment at a processing step subsequent to that shown by FIG. 7.

Referring to FIG. 8, a second conductive layer 30 of a second conductive material is provided over second gate oxide layer 28, and accordingly over substrate 12 and remaining first conductive layer region 26. In the preferred embodiment, the second conductive material constitutes polysilicon doped with a second conductivity type impurity, which in accordance with the described example would be n-type polysilicon. Alternately, one or the other of material 30 or material 24 of layer 26 might predominantly comprise some conductive material other than polysilicon, such as tungsten. Oxide layer 28 over remaining first region 26 will also desirably function as a mask to such remaining region to prevent n-type dopant from migrating into region 26.

Figure 9:
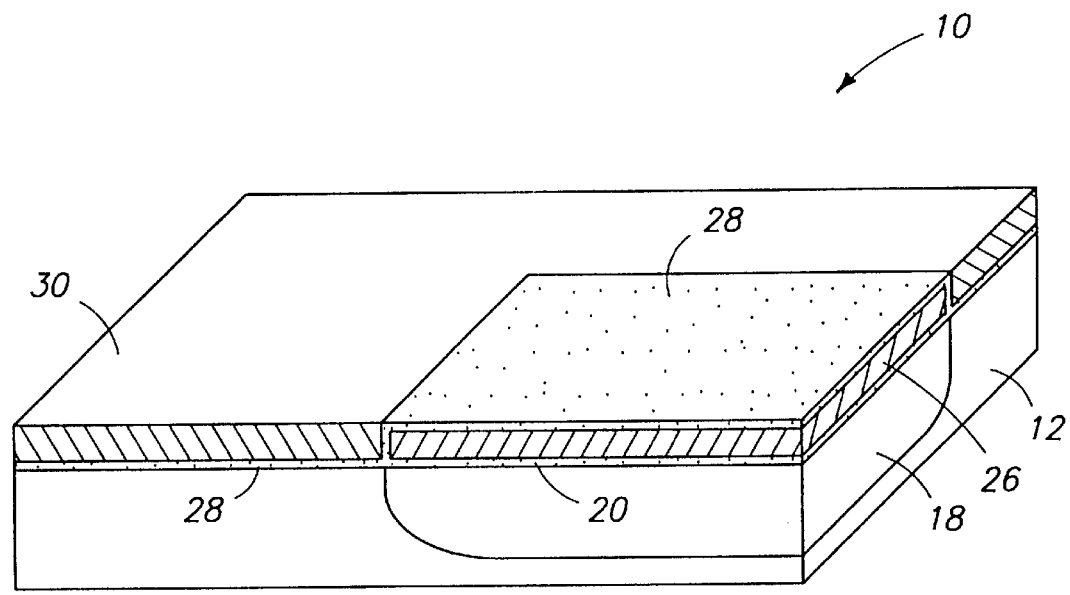
FIG. 9 is a view of the FIG. 1 wafer fragment at a processing step subsequent to that shown by FIG. 8.

Referring to FIG. 9, second conductive layer 30 is removed over first conductive layer 26, and accordingly oxide 28 formed thereatop, to eliminate all second conductive material from atop first deposited conductive layer 26. Second conductive material 30 is left atop the substrate and is adjacent remaining first conductive material region 26. Again, the preferred manner for effecting such a construction is by chemical-mechanical polishing although other planarizing technologies could be used. Oxide layer 28 over remaining region 26 is preferably utilized as an etch stop. If desired at this point in the process, oxide layer 28 can be wet stripped (not shown) selectively relative to the polysilicon of layers 26 and 30. This is desirable where a silicide cap is to be formed atop polysilicon 26.

Note that at this point in the pertinent described process all steps have been conducted utilizing only one mask step, yet complementary (i.e., different) conductive materials 30 and 24 (26) are adjacently provided.

Figure 10:
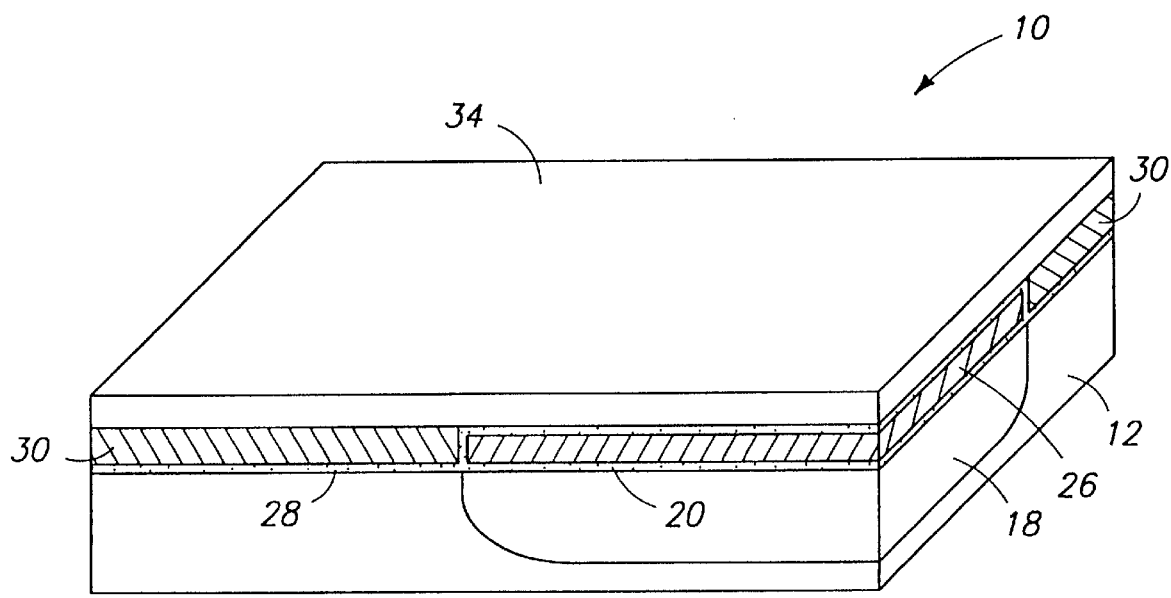
FIG. 10 is a view of the FIG. 1 wafer fragment at a processing step subsequent to that shown by FIG. 9.

Referring to FIG. 10, a nitride layer 34 (i.e., $Si_3N_4$) is provided, which can subsequently be utilized as a chemical-mechanical polishing stop layer.

Referring to FIG. 11, the underlying remaining first polysilicon region 26 and remaining second polysilicon layer 30 are patterned and etched using the same masking step to define complementary (i.e., different material) field effect transistor gates 35, 36, 37 and 38 from such first and second conductive layers.

Referring to FIG. 12, active field areas are ultimately masked and subjected to desired implants for producing source and drain regions for the complementary transistor gates, such as the illustrated source diffusion region 42 and drain diffusion region 44. Electrical connection with the conductive portions of the polysilicon gates would occur outwardly of plane of the figure as shown, or alternately as described below. Further, in the event suitable isolation were not provided by the illustrated construction between regions 42 and 44, an oxide trench could be provided therebetween within substrate 12.

Figure 13:
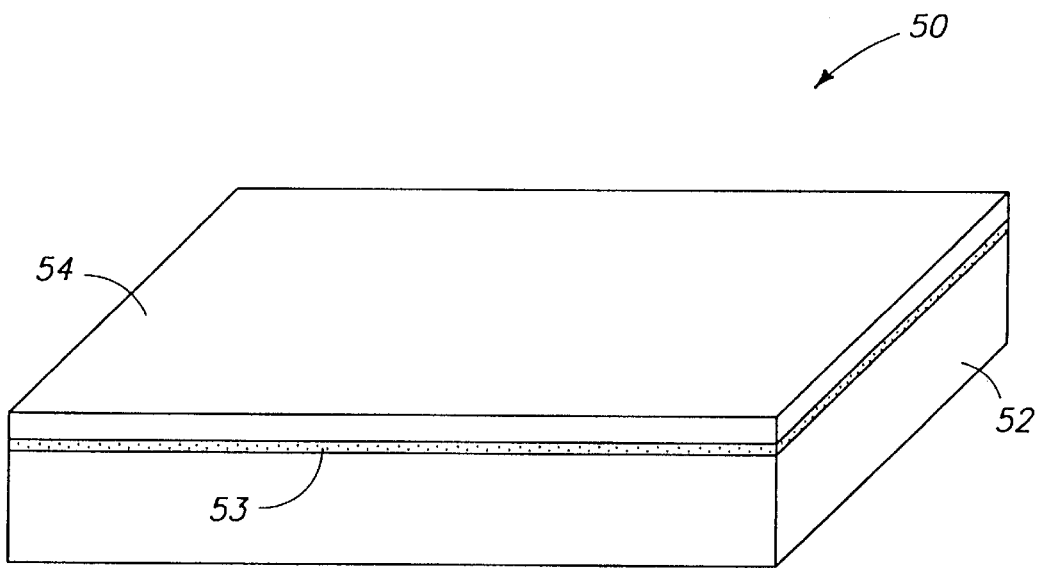
FIG. 13 is a diagrammatic isometric view of a semiconductor wafer fragment at one alternate processing step in accordance with the invention.

An alternate method in accordance with the invention is described with reference to FIGS. 13–20. Referring first to FIG. 13, there illustrated is a semiconductor wafer fragment 50 comprised of a bulk substrate 52 having a gate oxide layer 53 and an overlying first conductive layer 54 of a first conductive material. Example and preferred materials of construction would be as described with respect to the first embodiment shown in FIGS. 1–12. Accordingly, layer 54 preferably comprises conductively doped polysilicon of one type, and substrate 52 comprises monocrystalline silicon.

Figure 14:
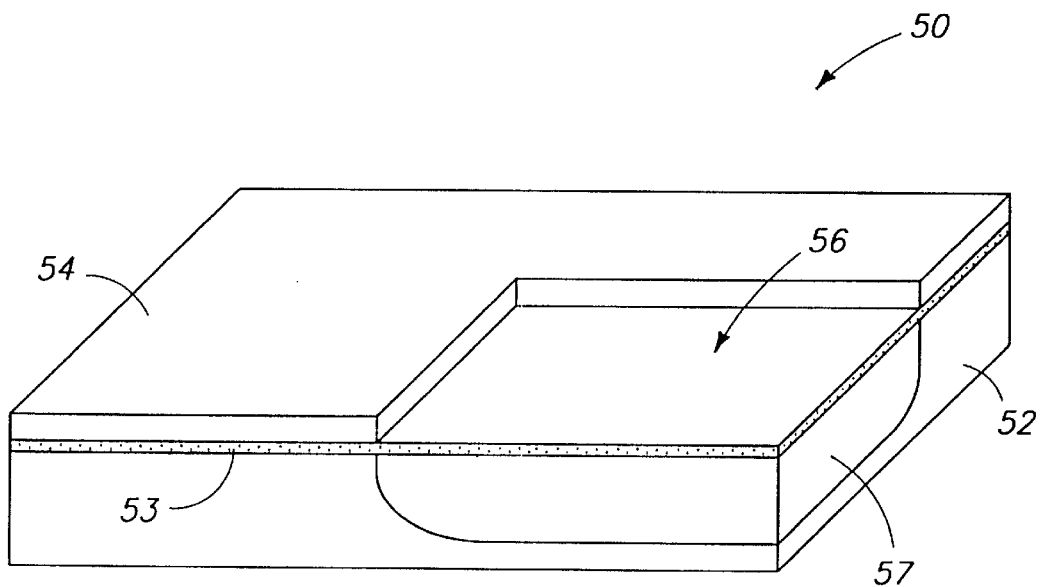
FIG. 14 is a view of the FIG. 13 wafer fragment at a processing step subsequent to that shown by FIG. 13.

Referring to FIG. 14, a void 56 is etched through first conductive layer 54 and gate oxide 53 inwardly in the direction of bulk substrate 52. A desired conductivity type well 57 is created.

Figure 15:
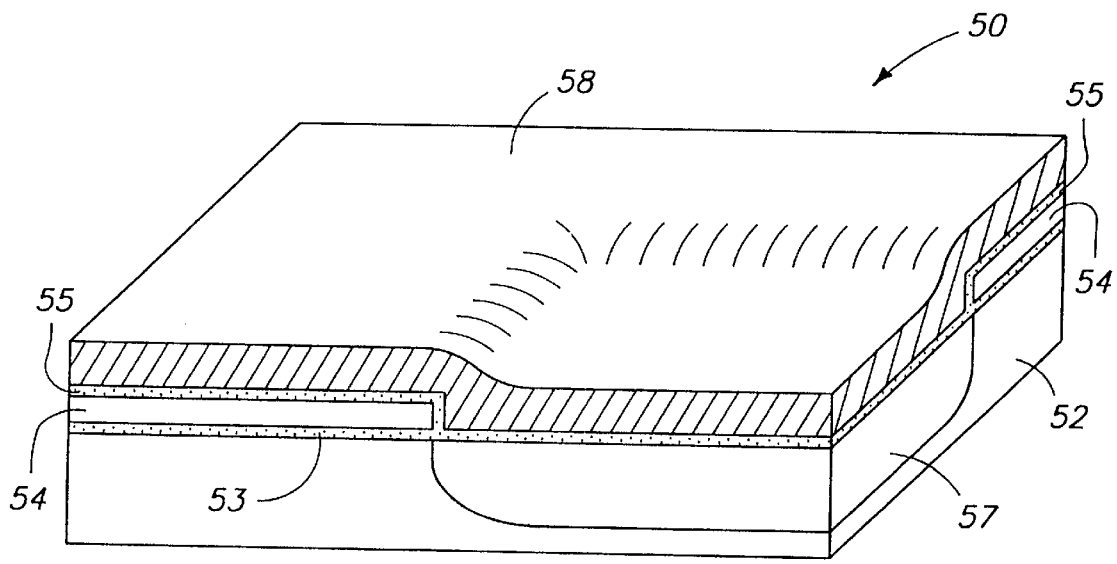
FIG. 15 is a view of the FIG. 13 wafer fragment at a processing step subsequent to that shown by FIG. 14.

Referring to FIG. 15, a gate oxide layer 55 is grown which also covers conductive layer 54. Then, a second conductive layer 58 of a complementary conductive material is provided over oxide layer 55 and first conductive layer 54 and into void 56. The second conductive material of layer 58 will constitute a material different from that of layer 54.

Figure 16:
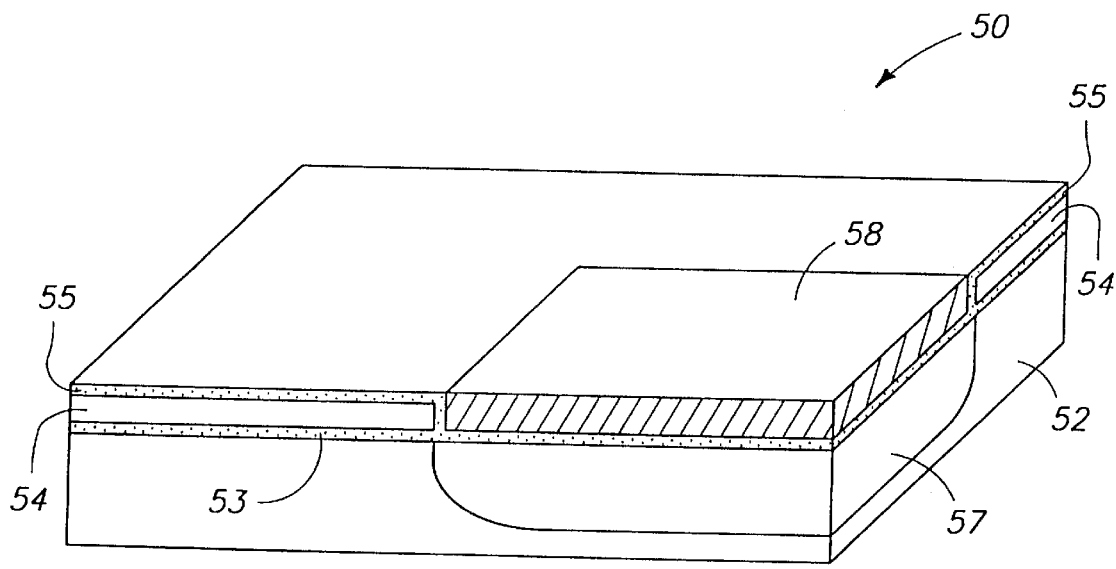
FIG. 16 is a view of the FIG. 13 wafer fragment at a processing step subsequent to that shown by FIG. 15.

Referring to FIG. 16, second conductive layer 58 overlying first conductive layer 54 is removed to eliminate all second conductive material from atop first conductive layer 54, and to leave second conductive material 58 adjacent first conductive material atop the substrate in prior void 56. Again, an example and preferred method for producing the construction of FIG. 16 would comprise chemical-mechanical polishing. Such could be conducted for a certain time interval or optimized for selectivity relative to removal of the materials of layers 54 and 58. Alternately, oxide layer 55 is used as an etch stop layer.

Figure 17:
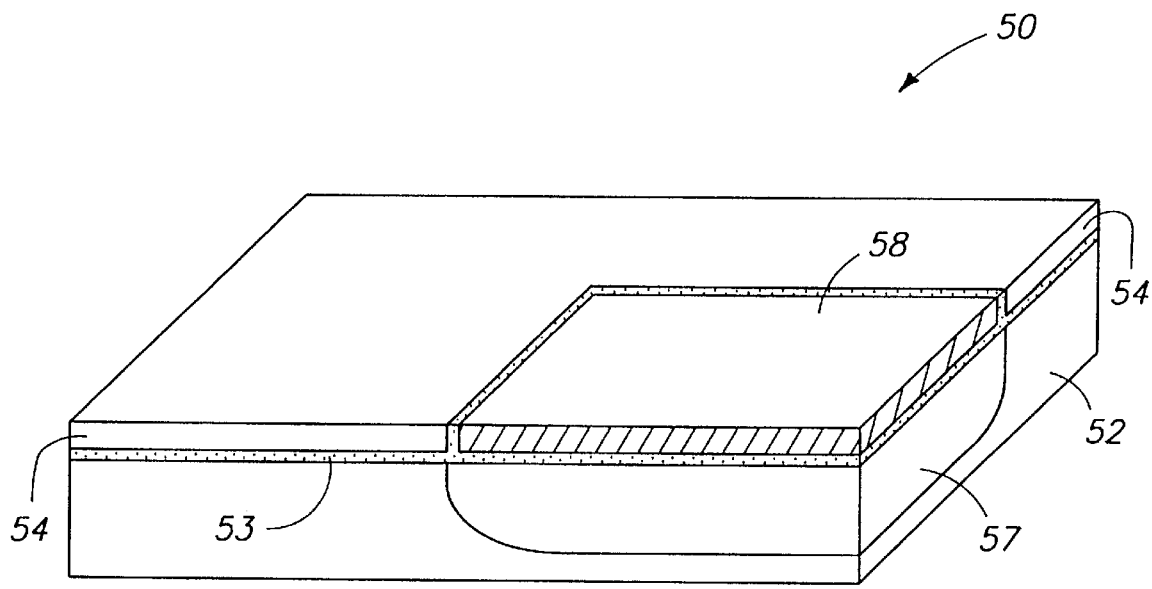
FIG. 17 is a view of the FIG. 13 wafer fragment at a processing step subsequent to that shown by FIG. 16.

Referring to FIG. 17, oxide layer 55 is wet stripped from the substrate selectively relative to the materials of layers 58 and 54. This outwardly exposes layers 58 and 54. A silicide layer (not shown) can be thereafter provided atop layers 58 and 54 if desired.

Figure 18:
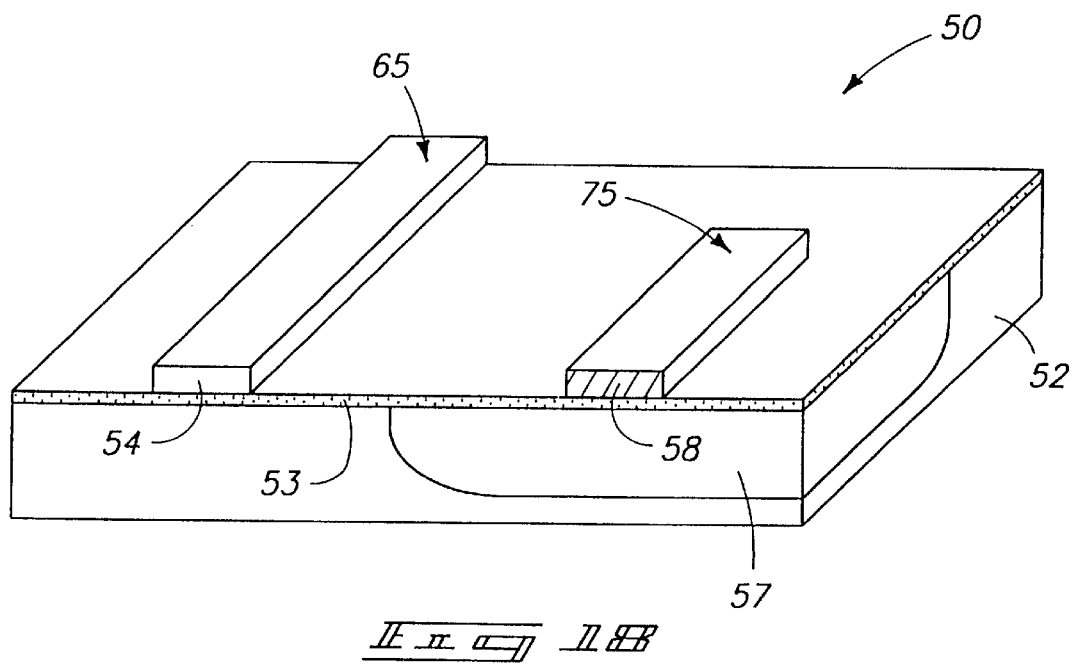
FIG. 18 is a view of the FIG. 13 wafer fragment at a processing step subsequent to that shown by FIG. 17.

Referring to FIG. 18, remaining first conductive layer 54 and remaining second conductive layer 58 are patterned and etched in the same masking step. This effectively separates or removes second conductive material from first conductive material, and defines complementary (i.e., different material) discrete circuit devices, such as the illustrated conductive lines 65 and 75.

Again in accordance with this embodiment, complementary first and second electrically conductive materials are utilized to produce different complementary devices at approximately the same level on the substrate, with the elimination of a mask step in the process.

Figure 19:
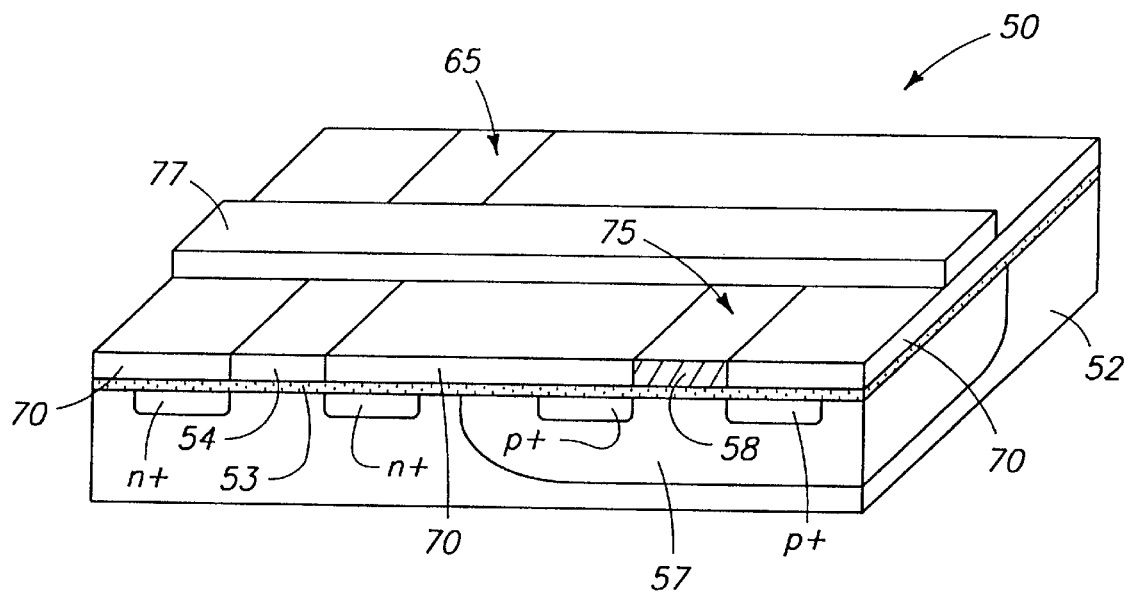
FIG. 19 is a view of the FIG. 13 wafer fragment at a processing step subsequent to that shown by FIG. 18.

Referring to FIG. 19, n+ and p+ source/drains are formed and then an electrically insulating isolation layer 70 is deposited and planarized. Subsequently, an electrically conductive layer is deposited and patterned to produce a conductive interconnecting link 77.

Figure 20:
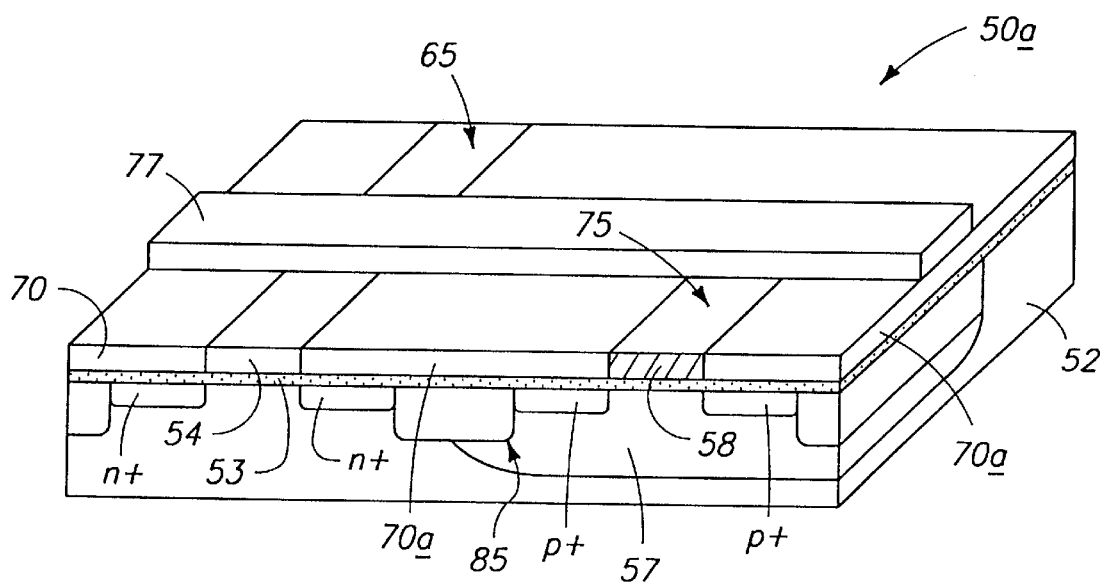
FIG. 20 is a diagrammatic isometric view of another alternate embodiment semiconductor wafer fragment at one alternate processing step in accordance with the invention.

An alternate embodiment 50a is shown in FIG. 20. Here an isolation trench 85 is provided within the substrate between n+ and p+diffusion regions. Layer 70a is subsequently deposited to fill trench 85. Such provides additional isolation between PMOS and NMOS transistors.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming complementary type conductive regions on a substrate comprising:
    providing a first etch stop layer over a substrate;
    etching a void through the first etch stop layer;
    providing a first conductive layer of a first conductive material over the first etch stop layer and into the void;
    removing the first conductive layer over the first etch stop layer to eliminate all first conductive material from atop the first etch stop layer, and leaving first conductive material in the void;
    removing the remaining first etch stop layer from the substrate thereby defining a remaining region of first conductive layer;
    providing a second conductive layer of a second conductive material over the substrate and remaining first conductive layer region;
    removing the second conductive layer over the remaining first conductive layer to eliminate all second conductive material from atop the remaining first conductive layer, and leaving remaining second conductive material atop the substrate which is adjacent the remaining first conductive material region; and
    after removing the second conductive layer, patterning and etching the remaining first conductive layer and remaining second conductive layer to define complementary discrete circuit devices from the first and second conductive layers.

2. The method of forming complementary type conductive regions of claim 1 wherein the first etch stop layer comprises a composite layer of an oxide and a nitride.

3. The method of forming complementary type conductive regions of claim 1 wherein the patterning and etching of the remaining first conductive layer and remaining second conductive layer occur together in a same masking step.

4. The method of forming complementary type conductive regions of claim 1 wherein the removing of the first conductive layer step is conducted by chemical-mechanical polishing.

5. The method of forming complementary type conductive regions of claim 1 wherein the removing of the first conductive layer step is conducted by application of a planarizing layer and etching the planarizing layer back.

6. The method of forming complementary type conductive regions of claim 1 further comprising providing a second etch stop layer over the first conductive layer prior to providing the second conductive layer.

7. The method of forming complementary type conductive regions of claim 1 further comprising providing a second etch stop layer over the first conductive layer prior to providing the second conductive layer, the etch stop layer constituting an oxide layer produced by oxidizing the exposed outer surface to the first conductive layer.

8. The method of forming complementary type conductive regions of claim 1 wherein the first conductive material comprises polysilicon doped with a first conductivity type impurity, and the second conductive material comprises polysilicon doped with a second conductivity type impurity.

9. The method of forming complementary type conductive regions of claim 1 wherein the first conductive material comprises polysilicon doped with a conductivity enhancing impurity of a p or n type, and the second conductive material predominantly comprises a material other than polysilicon.

10. The method of forming complementary type conductive regions of claim 1 wherein the substrate is comprised of one of a p or n conductivity type semiconductive material, the method further comprising implanting into the substrate through the void prior to providing the second conductive layer with the other of a p or n conductivity type implant material to form said other of a p or n type conductivity substrate well.

11. A method of forming complementary type conductive regions on a substrate comprising:

providing a substrate comprising a p or n conductivity type semiconductive material;

providing a first etch stop layer over the substrate;

etching a void through the first etch stop layer to outwardly expose the substrate;

providing a first conductive layer of a first conductive material over the first etch stop layer and into the void;

removing the first conductive layer over the first etch stop layer to eliminate all first conductive material from atop the first etch stop layer, and leaving first conductive material in the void;

removing the remaining first etch stop layer from the substrate thereby defining a remaining region of first conductive layer;

providing a second conductive layer of a second conductive material over the substrate and remaining first conductive layer region;

removing the second conductive layer over the remaining first conductive layer to eliminate all second conductive material from atop the remaining first conductive layer, and leaving remaining second conductive material atop the substrate which is adjacent the remaining first conductive material region;

implanting into the substrate through the void prior to providing the second conductive layer with the other of a p or n conductivity type implant material to form said other of a p or n type conductivity substrate well;

providing a first gate dielectric layer over the outwardly exposed substrate within the void prior to providing the first conductive layer over the substrate;

providing a second gate dielectric layer over the substrate after removing the first etch stop layer and before providing the second conductive layer; and after removing the second conductive layer, patterning and etching the remaining first conductive layer and remaining second conductive layer in the same masking step to define complementary discrete field effect transistor gates from the first and second conductive layers in a same masking step.

12. A method of forming complementary type polysilicon field effect transistors on a substrate comprising:

providing a first etch stop layer over a substrate;

etching a void through the first etch stop layer inwardly to the substrate;

oxidizing substrate exposed by the void to form a first gate oxide layer;

providing a first layer of polysilicon of a first conductivity type over the first etch stop layer and into the void over the first gate oxide layer;

removing the first layer of polysilicon over the first etch stop layer to eliminate all polysilicon from atop the first etch stop layer, and leaving first conductivity type polysilicon in the void;

removing the remaining first etch stop layer from the substrate thereby defining a remaining region of first conductivity type polysilicon;

oxidizing substrate exposed by removal of the first etch stop layer to form a second gate oxide layer, said oxidizing steps being differently conducted to produce different first and second gate oxide layers which are separately optimized for their associated respective field effect transistors;

providing a second layer of polysilicon of a second conductivity type over the second gate oxide layer and remaining first conductivity type polysilicon region;

removing the second layer of polysilicon over the remaining first layer of polysilicon to eliminate all second conductive material from atop the remaining first layer of polysilicon, and leaving second layer polysilicon atop the substrate which is adjacent the remaining first polysilicon region;

patterning and etching the remaining first polysilicon region and remaining second polysilicon layer in the same masking step to define complementary transistor gates in the same masking step; and implanting source and drain regions for the complementary transistor gates.

13. The method of forming complementary type polysilicon field effect transistors of claim 12 further comprising:

conducting a first optimized $V_T$ implant into the substrate through the void after etching the first etch stop layer and before providing the first layer of polysilicon; and conducting a second optimized $V_T$ implant into the substrate after removing the remaining first etch stop layer and before providing the second layer of polysilicon.

14. The method of forming complementary type polysilicon field effect transistors of claim 12 further comprising providing an electrically conductive layer over the remaining first polysilicon region and remaining second polysilicon layer prior to the patterning and etching step.

* * * * *

UNITED STATES PATENT AND TRADEMARK OFFICE
CERTIFICATE OF CORRECTION

PATENT NO.   : 6,074,902
DATED        : June 13, 2000
INVENTOR(S)  : Trung Tri Doan et al.

It is certified that error appears in the above-identified patent and that said Letters Patent are hereby corrected as shown below:

In Abstract [57] g) change "all second is conductive" to --all second conductive--.
Column 1, line 27, change "r-type" to --n-type--.
Column 1, line 40, change "ha s applicability" to --has applicability--.
Column 3, line 20 change "first a conductive" to --first conductive--.

Signed and Sealed this

First Day of May, 2001

Attest:

NICHOLAS P. GODICI

Attesting Officer          Acting Director of the United States Patent and Trademark Office